United States Patent
Wu et al.

(10) Patent No.: US 8,134,843 B2
(45) Date of Patent: Mar. 13, 2012

(54) SERVER

(75) Inventors: Jian-Feng Wu, Shanghai (CN);
Tsai-Kuei Cheng, Taipei (TW)

(73) Assignee: Inventec Corporation, Taipei (TW)

( * ) Notice: Subject to any disclaimer, the term of this patent is extended or adjusted under 35 U.S.C. 154(b) by 273 days.

(21) Appl. No.: 12/701,524

(22) Filed: Feb. 6, 2010

(65) Prior Publication Data
US 2011/0194245 A1 Aug. 11, 2011

(51) Int. Cl.
*H05K 7/14* (2006.01)
(52) U.S. Cl. .......................... 361/796; 361/788; 710/301
(58) Field of Classification Search .................. 361/788, 361/796; 211/41.17; 710/300, 301
See application file for complete search history.

(56) References Cited

U.S. PATENT DOCUMENTS

| | | | | |
|---|---|---|---|---|
| 6,166,917 A * | 12/2000 | Anderson | | 361/756 |
| 6,411,506 B1 * | 6/2002 | Hipp et al. | | 361/679.41 |
| 6,452,789 B1 * | 9/2002 | Pallotti et al. | | 361/679.02 |
| 6,659,803 B1 * | 12/2003 | Chen | | 439/638 |
| 6,742,068 B2 * | 5/2004 | Gallagher et al. | | 710/302 |
| 2010/0005211 A1 * | 1/2010 | Wen et al. | | 710/302 |

* cited by examiner

*Primary Examiner* — Dameon Levi
(74) *Attorney, Agent, or Firm* — CKC & Partners Co., Ltd.

(57) ABSTRACT

A server is disclosed, which includes two dividing plates disposed between the side plates, several rails disposed on the side plates and the dividing plates, at least one adapter board module, and several main boards. The dividing plates are parallel to the side plates. Each dividing plate has a position pin. The rails are parallel to the bottom plate. The main boards are slid in the rails. The adapter board module has a support piece and an adapter board. The support piece has position holes to be coupled to the position pins and fix the adapter board module on the dividing plates. The adapter board is disposed on the support piece and has two first gold finger interfaces. Each main board has a second gold finger interface. The first gold finger interfaces are coupled to the second gold finger interfaces, thereby each adapter board is connected to two main boards.

10 Claims, 3 Drawing Sheets

SERVER

BACKGROUND

1. Field of Invention

The present invention relates to an electric device. More particularly, the present invention relates to a server.

2. Description of Related Art

As the technology advances continuously and the dependence on the computer system is higher, the requirement of the market to the operation and data storage abilities are required relatively high in the market. In order to provide and store the data required for the customers, the computer system must have many hard disks and other storage media for providing the service of data accessing. The main boards, the aforementioned storage media and other built-in peripheral equipments are all installed in the case, so that it can provide a user with the required service efficiently. In the example of the server case, since the space of the server case is very limited, and it is more important that the various components are assembled in the case efficiently.

SUMMARY

Accordingly, an aspect of the present invention is to provide a server for more smooth assembly.

According to an embodiment, the present invention discloses a server, which includes a case having a bottom plate and two parallel side plates, two dividing plates disposed between the side plates, a plurality of rails disposed on the side plates and the dividing plates, at least one adapter board module, and a plurality of main boards. The dividing plates are parallel to side plates and include at least one position pin. The rails are parallel to the bottom plate, and each main board is slid in the corresponding rail. The adaptor board module includes a supporting piece and an adaptor board. The support piece has at least one position hole coupled to the position pins, for fixing the adaptor board module to the dividing plates. The adapter board is disposed on the support piece and parallel to the bottom plate. The adaptor board comprises two first gold finger interfaces. Each main board comprises a second gold finger interface coupled to each corresponding first finger interface, for connecting with each adaptor board and two corresponding main boards.

The adaptor board module further includes a plurality of screws for fixing the adaptor board to the support piece. The position pins are respectively disposed on two face-to-face sides of the two dividing plate face. The support piece has a protrusion interlaid between the two dividing plates, and the position holes are disposed on two sides of the protrusion respectively. The position hole has a position end and an entry end wider than the position end. The entry end has a first opening toward the bottom board, the position end has a second opening parallel to the bottom board, and the position pins are entered into the position ends by putting the adaptor board module downward, passing the position pins through the first and second openings, and horizontally moving the adaptor board module. Each of two ends of the support piece has a fixation portion respectively, and the fixation portions are against and fixed to the side plates. The server further includes a middle partition plate, a management board and a plurality of fans. The middle partition plate is disposed on a side of the adaptor board module opposing to the main boards. The fans are electrically connected to the management board. The management board is electrically connected to the adaptor board via a cable set that passes through the middle partition board. The fans and the main boards are disposed on two separate sides of the adaptor board respectively. The adaptor board further includes a first power connector interface disposed on the protrusion. The server further includes a power supply module disposed between the dividing plates. The power supply module includes a power distribution board and a power supplier. The power distribution board is fixed between the dividing plates, in which the power distribution board has a second power connector interface correspondingly connected to the first power connector interface. The power supplier is slid between the dividing plates and connected to the power distribution board. The main boards are disposed on two separate sides of the power supply module respectively.

With application of the module-based design of the adaptor board, the assembling process of the adaptor board is more smooth and simple. The server can be connected to the adaptor board module and the main boards via the gold finger interfaces. The main boards are slid in the case, so as prevent various inconveniences due to the cable connection.

BRIEF DESCRIPTION OF THE DRAWINGS

The invention can be more fully understood by reading the following detailed description of the embodiment, with reference made to the accompanying drawings as follows.

DETAILED DESCRIPTION

In view of the below disclosure and drawings, it is intended that the present invention covers modifications and variations of this invention provided they fall within the scope of the following claims. The skilled artisan in the art can readily understand the invention by reading the detailed description of the embodiment in the below, with reference made to the accompanying drawings as follows. In view of the following, it is intended that the present invention cover modifications and variations of this invention provided they fall within the scope of the following claims.

Figure 1:
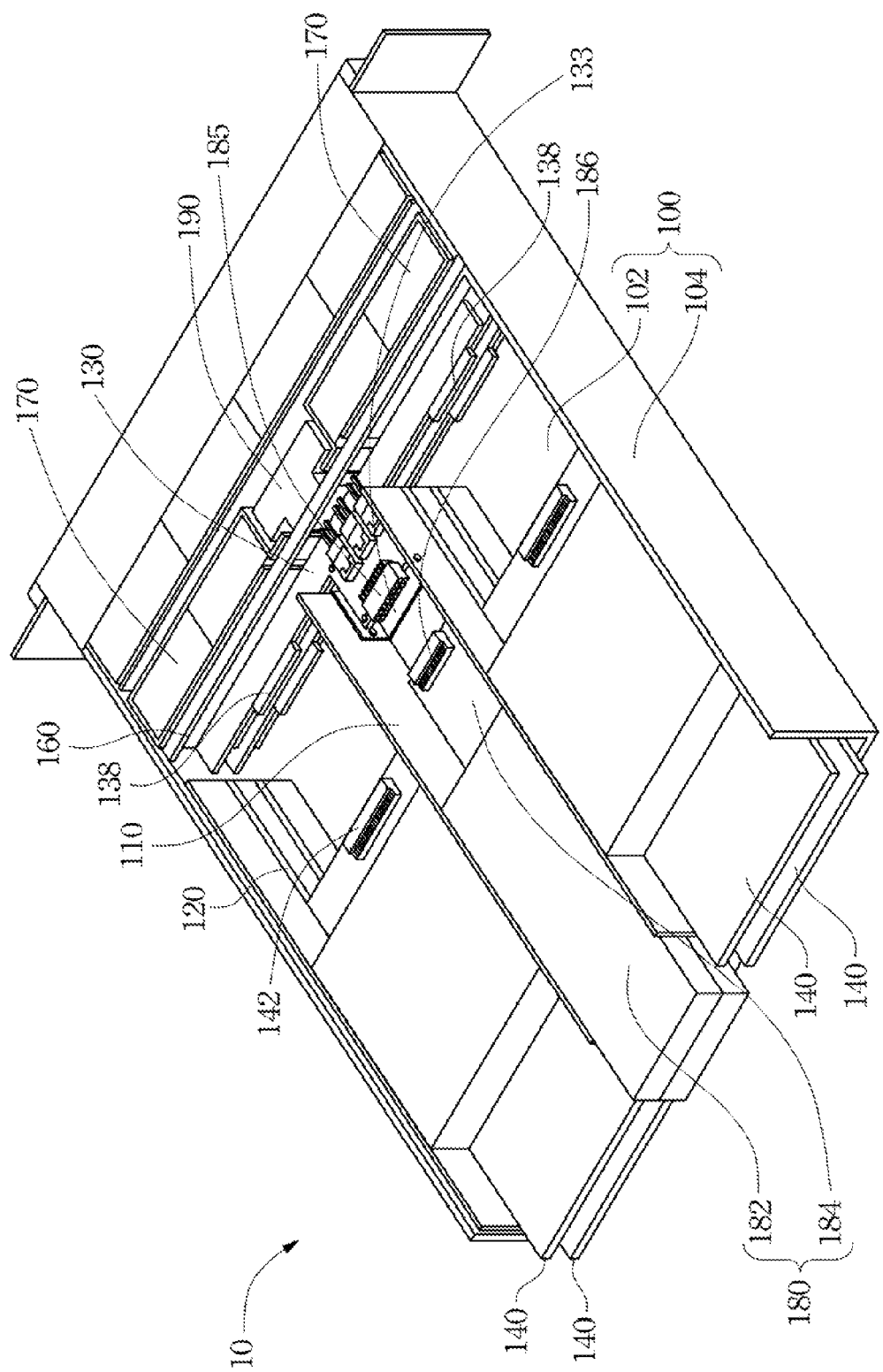
FIG. 1 depicts an explored diagram of a server according to an embodiment of the present invention.

Reference is made to FIG. 1, which depicts an explored diagram of a server according to an embodiment of the present invention. The server 10 includes a case 100 having a bottom plate 102 and two parallel side plates 104, the side plates 104 are disposed on two sides of the bottom plate 102 respectively, and the side plates 104 are parallel with each other. The server 10 includes two dividing plates 110 disposed between and parallel to the side plates 104. The server 10 includes a plurality of main boards 140, a plurality of rails are disposed on the side plates 104 and the dividing plates 110, so that the main boards 140 can be slid in the corresponding rails 120, respectively. The rails 120 provide conveniently disassemble and assemble for facilitating the installment and maintenance of the server 10.

The server 10 further includes at least one adapter board module 130. In this embodiment, the server 10 is a two-layer structure, the corresponding adaptor module 130 are divided into two parts in numbers, and two adaptor board modules 130 and the main boards 140 are disposed on the upper and lower layers of the case 100. Each adaptor board module 130 includes two first finger interfaces 138, and each main board 140 comprises a second gold finger interface 142. When the main boards 140 are slid in the case 100, each second gold finger interface 142 of each main board 140 is coupled to each corresponding first finger interface 138 of the adaptor board module 130, for connecting with each adaptor board 130 and two corresponding main boards 140. Each adaptor board module 130 is connected to two corresponding main boards 140. Similarly, the server can be design to have more layers to enhance the operation ability and to save the space.

The server 10 further includes two power supply modules 180 disposed between the dividing plates 110. The main boards 140 are disposed on two separate sides of the power supply module 180 respectively. A delaminated board (not shown) is further disposed between the dividing plates 110, for dividing the space between the dividing plates 110 into a upper space and a lower space in a two-layer server 10. Each power supply module 180 includes a power supplier 182 and a power distribution board 184. The power distribution board 184 is fixed between the dividing plates 110, in which two power distribution boards 184 can be fixed on the delaminated board and the bottom plate 102, respectively. The power supplier 182 is slid between the dividing plates 110 and connected to the power distribution board 184.

The adaptor board module 130 has a protrusion 133 interlaid between the two dividing plates 110. The adaptor board module 130 has a first power connector interface 185 disposed at a top end of the protrusion 133 toward the power distribution board 184. The power distribution board 184 has a corresponding second power connector interface 186. The first power connector interface 185 and the second power connector interface 186 are coupled to connect the power distribution board 184 with the adaptor board module 130. Hence, the space utility ratio of the server can be increased, which is based on the connection relationship between the adaptor board module 130 and several components of the server 10, as well as those components with easy disassemble, assemble and reasonable space arrangement.

The server 10 further includes a middle partition plate 160, a plurality of fans 170 and a management board 190. The middle partition plate 160 is disposed on a side of the dividing plate 110 and vertical to the dividing plates 110. The middle partition plate 160 is disposed on a side of the adaptor board module 130 opposing to the main boards 140. In this embodiment, the fans 170 are disposed on two separate sides of the management board 190, electrically connected to the management board 190, and the management board 190 is electrically connected to the adaptor board module 130 via a cable set (not shown) that passes through the middle partition board 160. The fans 170 and the adaptor board module 130 are disposed on two separate sides of the middle partition plate 160 respectively, and the fans 170 and the main boards 140 are disposed on two separate sides of the adaptor board module 130.

Figure 2:
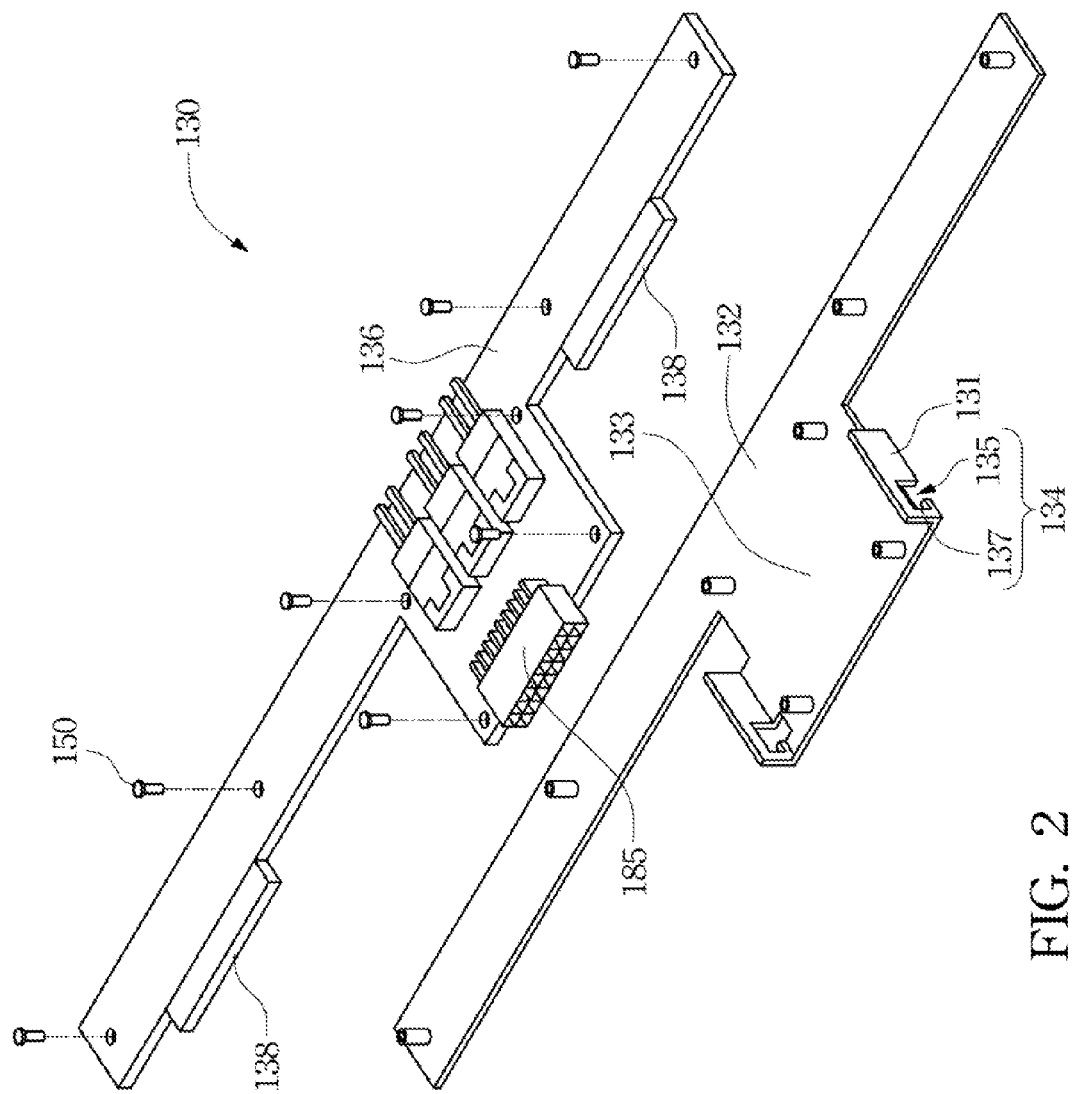
FIG. 2 depicts an explored diagram of the adaptor board module of FIG. 1.

Reference is made to FIG. 2, which depicts an explored diagram of the adaptor board module 130 of FIG. 1. The adaptor board module 130 includes a supporting piece 132 and an adaptor board 136. The adaptor board 136 can be fixed in the supporting piece 132 by using a plurality of screws 150, so that the supporting piece 132 and the adaptor board 136 are formed a whole. The adaptor board 136 and the supporting piece 132 are shown as a shape closely to a T-shape, the supporting piece 132 has the protrusion 133, and the first power connector interface 185 of the adaptor board 136 is disposed at the top end of the protrusion 133. The adaptor 136 has two first gold finger interfaces 138 disposed on two separate side of the protrusion 133.

The supporting piece 132 has two folded edges 131 disposed on two side of the protrusion 133. A position hole 134 is on each folded edge 131 and coupled to the position pins of the dividing plates 110. The position hole 134 is shown as a shape closely to an L-shape, which includes a position end 137 and an entry end 135 connected with each other. The entry end 135 has a first opening toward the bottom board 102 of FIG. 1, and the position end 137 has a second opening parallel to the bottom board 102. The entry end 135 has a width larger than the position end 137.

Figure 3:
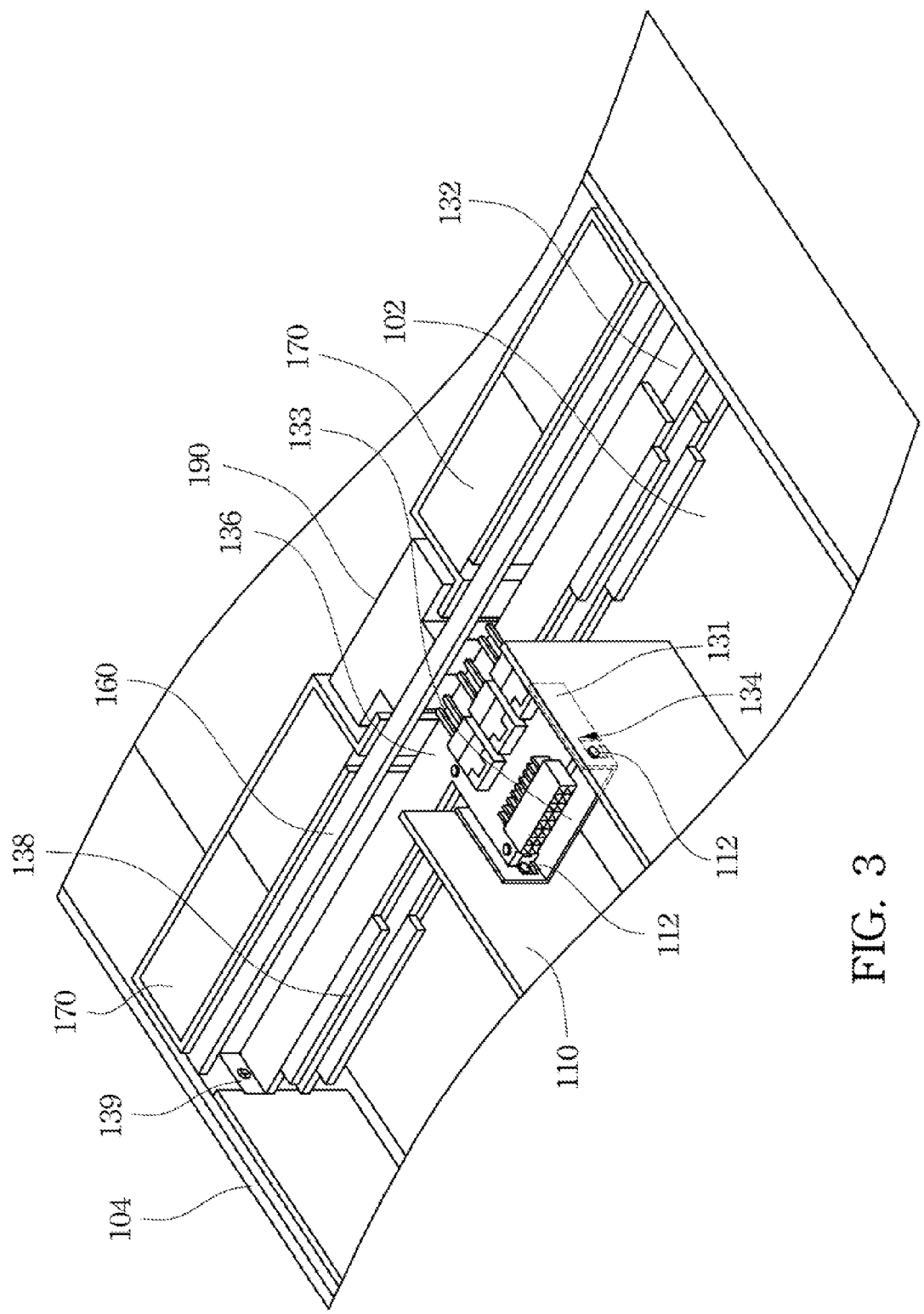
FIG. 3 depicts a partially explored diagram of the server of FIG. 1.

Reference is made to FIG. 3, which depicts a partially explored diagram of the server of FIG. 1. The protrusion 133 of the supporting piece 132 is disposed between the two dividing plates. The position hole 134 is on each folded edge 131 of two sides of the protrusion 133. The middle partition plate 160 is disposed on a side of the supporting piece 132 far away from the dividing plate 110, and the fans 170 are optionally disposed on another side of the middle partition plate 160. The first gold finger interfaces 138 of the adaptor hoard 136 are disposed on two separate sides of the dividing plates 110. Each dividing plates 110 has at least one position pin 112 disposed on face-to-face sides of the two dividing plates 110. The position pins and the position hole 134 are coupled with each, so as to position the supporting piece 132 and the adaptor board 136 disposed thereon.

Reference is made to FIGS. 2 and 3. The entry end 135 of the position hole 134 is toward the bottom board 102, and the position end 137 of the position hole 134 is parallel to the bottom board 102. During assembling the adaptor board module 130, the position pins 112 are entered into the entry end 135 of the position hole 134 by putting the adaptor board module downward 130. Next, the position pins 112 are entered into the position end 137 of the position hole 134 by horizontally moving the adaptor board module 130. For the position end 137 of the position hole 134 is less than the entry end 135 of the position hole 134 in width, and after the position pins 112 are entered into the position end 137, the position pins 112 will be coupled to the position end 137 and fix the adaptor board module 130

A fixation portion 139 is disposed on two ends of the support piece 132, respectively. After the position pins 112 are coupled to the position hole 134 for fixing the adaptor board module 130, the fixation portion 139 against the side plates 104 is fixed to the side plates 104 by using the screws 150, so as to fix the supporting piece 132 on the side plates 104. Therefore, fewer screws can be utilized to fix the adaptor board module 130, and the adaptor board module 130 is easily dissembled and assembled. Moreover, the supporting piece 132 and the adaptor board 136 are fixed as a whole. If there is a need to assemble or dissemble the adaptor board 136, the adaptor board module 130 with less fixation components will be used to assemble or dissemble, thereby conveniently dissemble the adaptor board 136.

According to the preferred embodiments of the present invention, the aforementioned server is beneficial to make the assembling process of the adaptor board smoother and simpler by using the design of the adaptor board module. Moreover, the server can be connected to the adaptor board module and the main boards via the gold finger interfaces. The main boards are slid in the case, so as prevent various inconveniences due to the cable connection.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A server, comprising:
   a case having a bottom plate and two parallel side plates;
   two dividing plates disposed between and parallel to the sideplate wherein each dividing plate has at least one position pin;
   a plurality of rails disposed on the side plates and the dividing plates, wherein the rails are parallel to the bottom plate;
   at least one adapter board module, comprising:
      a support piece having at least one position hole coupled to the position pins, for fixing the adaptor board module to the dividing plates; and
      an adapter board disposed on the support piece and parallel to the bottom plate, wherein the adaptor board comprises two first gold finger interfaces; and
   a plurality of main boards each of which is slid in the corresponding rail, wherein each main board comprises a second gold finger interface coupled to each corresponding first finger interface, for connecting with each adaptor board and two corresponding main boards.

2. The server of claim 1, wherein the position pins are respectively disposed on two face-to-face sides of the two dividing plates, the support piece has a protrusion interlaid between the two dividing plates, and the position holes are disposed on two sides of the protrusion respectively.

3. The server of claim 2, wherein the position hole has a position end and an entry end wider than the position end.

4. The server of claim 3, wherein the entry end has a first opening toward the bottom board, the position end has a second opening parallel to the bottom board, and the position pins are entered into the position ends by putting the adaptor board module downward, passing the position pins through the first and second openings, and horizontally moving the adaptor board module.

5. The server of claim 1, wherein each of two ends of the support piece has a fixation portion respectively, and the fixation portions are against and fixed to the side plates.

6. The server of claim 1, further comprising:
   a middle partition plate vertically to the dividing plates and disposed on a side of the adaptor board module opposing to the main boards;
   a management board electrically connected to the adaptor board via a cable set that passes through the middle partition plate; and
   a plurality of fans electrically connected to the management board.

7. The server of claim 6, wherein the fans and the main boards are disposed on two separate sides of the adaptor board respectively.

8. The server of claim 2, wherein the adaptor board further comprises a first power connector interface disposed on the protrusion.

9. The server of claim 8, further comprising:
   a power supply module disposed between the dividing plates, wherein the power supply module comprises:
      a power distribution board fixed between the dividing plates, wherein the power distribution board has a second power connector interface correspondingly connected to the first power connector interface; and
      a power supplier slid between the dividing plates and connected to the power distribution board.

10. The server of claim 9, wherein the main boards are disposed on two separate sides of the power supply module respectively.

* * * * *